United States Patent
Chen et al.

(10) Patent No.: US 9,368,584 B2
(45) Date of Patent: Jun. 14, 2016

(54) GALLIUM NITRIDE POWER SEMICONDUCTOR DEVICE HAVING A VERTICAL STRUCTURE

(71) Applicant: Vishay General Semiconductor LLC, Hauppauge, NY (US)

(72) Inventors: Max Sk Chen, New Taipei (TW); Yih-Yin Nmi Lin, Taipei (TW)

(73) Assignee: VISHAY GENERAL SEMICONDUCTOR LLC

( * ) Notice: Subject to any disclaimer, the term of this patent is extended or adjusted under 35 U.S.C. 154(b) by 103 days.

(21) Appl. No.: 13/937,724

(22) Filed: Jul. 9, 2013

(65) Prior Publication Data
US 2015/0014696 A1 Jan. 15, 2015

(51) Int. Cl.
*H01L 29/205* (2006.01)
*H01L 29/20* (2006.01)
*H01L 29/778* (2006.01)
*H01L 29/66* (2006.01)

(52) U.S. Cl.
CPC .......... *H01L 29/205* (2013.01); *H01L 29/2003* (2013.01); *H01L 29/66469* (2013.01); *H01L 29/7787* (2013.01); *H01L 29/7788* (2013.01)

(58) Field of Classification Search
CPC .................................................. H01L 29/7788
See application file for complete search history.

(56) References Cited

U.S. PATENT DOCUMENTS

| 7,851,825 B2 | 12/2010 | Suh et al. |
| 7,898,004 B2 | 3/2011 | Wu et al. |
| 8,390,027 B2 * | 3/2013 | Iwamuro ........... H01L 21/02381 257/183 |
| 2006/0108659 A1 * | 5/2006 | Yanagihara et al. .......... 257/471 |
| 2011/0101370 A1 | 5/2011 | Cheng et al. |
| 2012/0007049 A1 | 1/2012 | Jeon et al. |
| 2013/0153919 A1 | 6/2013 | Curatola et al. |
| 2014/0264453 A1 * | 9/2014 | Moens et al. ................. 257/194 |

FOREIGN PATENT DOCUMENTS

| JP | 2008-306200 A | 12/2008 |
| JP | 2010-283048 A | 12/2010 |
| JP | 2012-099542 A | 5/2012 |

* cited by examiner

*Primary Examiner* — Mohammad Islam
*Assistant Examiner* — John P Dulka
(74) *Attorney, Agent, or Firm* — Stuart H. Mayer; Mayer & Williams PC

(57) ABSTRACT

A semiconductor device includes a substrate having first and second sides and a first active layer disposed over the first side of the substrate. A second active layer is disposed on the first active layer. The second active layer has a higher bandgap than the first active layer such that a two-dimensional electron gas layer arises between the first active layer and the second active layer. At least one trench extends through the first and second active layers and the two-dimensional electron gas layer and into the substrate. A conductive material lines the trench. A first electrode is disposed on the second active layer and a second electrode is disposed on the second side of the substrate.

17 Claims, 5 Drawing Sheets

GALLIUM NITRIDE POWER SEMICONDUCTOR DEVICE HAVING A VERTICAL STRUCTURE

BACKGROUND

Gallium nitride (GaN) is a potential material to replace Silicon (Si) in high power applications. GaN has a high breakdown voltage, excellent transport properties, fast switching speed and good thermal stability. Gallium nitride is also more cost effective than silicon carbide. Another advantage is that the hetero-structure formed from aluminum gallium nitride (AlGaN) and gallium nitride gives rise to a two-dimensional channel of high-mobility electrons, which enable the GaN devices to achieve a lower on-resistance at the same reverse bias than silicon and silicon carbide.

GaN may provide a technology platform for a wide variety of different semiconductor devices including, for example, diodes and transistors. Diodes are used in a wide range of electronic circuits. Diodes used in circuits for high voltage switching applications ideally require the following characteristics. When biased in the reverse direction (i.e., the cathode is at a higher voltage than the anode), the diode should be able to support a large voltage while allowing as little current as possible to pass through. The amount of voltage that must be supported depends on the application; for example, many high power switching applications require diodes that can support a reverse bias of at least 600 V without passing a substantial amount of current. Finally, the amount of charge stored in the diode when it is reverse biased should be as small as possible to reduce transient currents in the circuit when the voltage across the diode changes, thereby reducing switching losses.

FIG. 1 shows an example of a conventional GaN-based diode. The diode 100 includes a substrate 110, a GaN buffer layer 120, a GaN epitaxial ("epi") layer 130 and an aluminum gallium nitride barrier layer 135. A first metal layer forms a Schottky contact 140 to the aluminum gallium nitride barrier layer 135 and a second metal layer forms an Ohmic contact 150 to the aluminum gallium nitride barrier layer 135. The Schottky contact 140 serves as the device anode and the Ohmic contact 150 serves as the device cathode. A passivation layer 160 is located between the Schottky contact 140 and the Ohmic contact 150.

A quantum well is formed at the hetero junction interface between the AlGaN layer, which has a large band gap, and the GaN layer, which has a narrower band gap. As a result, electrons are trapped in the quantum well. The trapped electrons are represented by a two-dimensional (2DEG) electron gas 170 in the GaN epi layer and as a consequence electrons flow along the channel between the anode and cathode. Thus, because its operation is based on a two-dimensional electron gas, the charge carriers in the channel establish a current in the lateral direction.

One problem with the diode shown in FIG. 1 is that its on-resistance is relatively large due to the added total contact resistance since the forward current of the 2DEG electron gas has to channel through the AlGaN barrier layer 135 to reach the cathode 150, where the Ohmic contact resistance to GaN-based materials is generally significantly higher compared to silicon. Additionally, because the anode and cathode are located on the same face of the device, the die area that is required is also relatively large. Moreover, the diode's thermal performance is relatively poor because thermal dissipation is limited to only one side of the die.

SUMMARY

In accordance with the present invention, a semiconductor device includes a substrate having first and second sides and a first active layer disposed over the first side of the substrate. A second active layer is disposed on the first active layer. The second active layer has a higher bandgap than the first active layer such that a two-dimensional electron gas layer arises between the first active layer and the second active layer. At least one trench extends through the first and second active layers and the two-dimensional electron gas layer and into the substrate. A conductive material lines the trench. A first electrode is disposed on the second active layer and a second electrode is disposed on the second side of the substrate.

DETAILED DESCRIPTION

It is worthy to note that any reference herein to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment. Moreover, the various embodiments may be combined in a multiplicity of ways to yield additional embodiments that are not explicitly shown herein.

Figure 1:
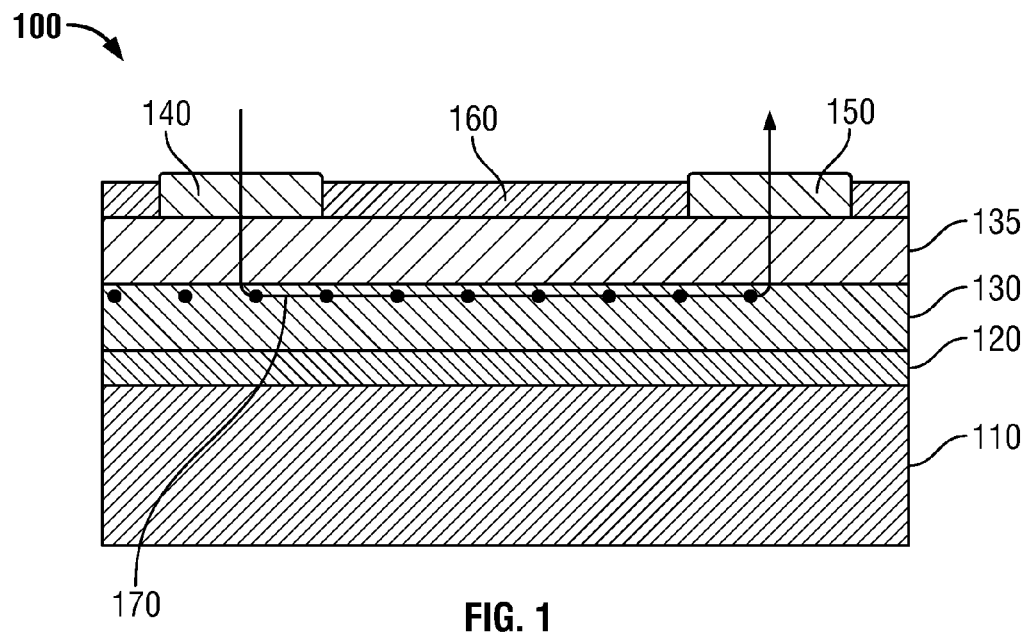
FIG. 1 shows an example of a conventional GaN-based diode.

As detailed below, a GaN-based power device such as a diode or a transistor, for example, is provided which has a relatively low on-resistance. As previously mentioned, there are a number of disadvantages arising from the use of lateral GaN-based device such as shown in FIG. 1. These disadvantages include an increase in the on-resistance, an increase in the area occupied by the device, and poor heat dissipation.

In contrast, as detailed below, a vertical GaN-based power device such as diode or transistor can overcome these problems. Such a device can be achieved by moving the cathode from the top of the device, as shown in the conventional device of FIG. 1, to the back of the device where it is in contact with a low-resistivity substrate 210. In this way the current is conducted both laterally (through the 2-D channel) and vertically between the anode and the cathode. As a result, current flowing from the top electrode can travel in the 2D channel and then flow to the bottom electrode, thus reducing the total resistance. A conductive path is provided between the 2-D channel and the cathode in order to conduct the current to the cathode. In one embodiment, the conductive path is provided by lining one or more trenches with a conductive material.

Figure 2:
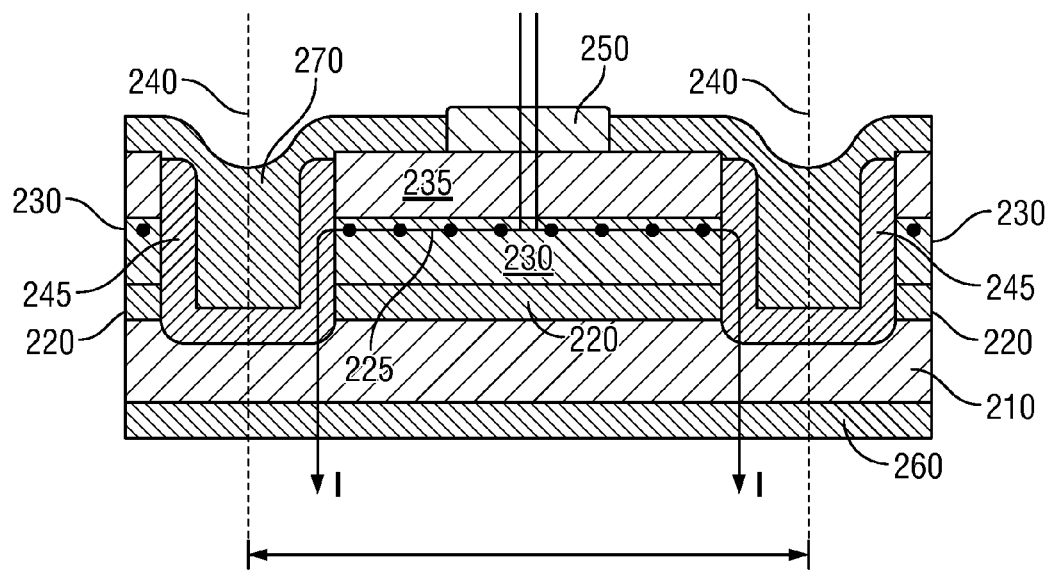
FIG. 2 shows an example of a GaN-based diode constructed in accordance with the present invention.

FIG. 2 shows an example of a GaN-based diode constructed in accordance with the present invention. The diode includes a low resistivity substrate 210, a GaN buffer layer 220, a first active layer such as a GaN epi layer 230 and a second active layer such as an aluminum gallium nitride ($Al_xGa_{1-x}N$; $0<X<1$) barrier layer 235. A pair of trenches 240 are etched through the barrier layer 235, the GaN epi layer 230 and the GaN buffer layer 220 and extend into the low resistivity substrate 210. The trenches 240 are lined with a conductive material 245 such as titanium, aluminum or gold. A first metal layer forms a Schottky contact 250 with the aluminum gallium nitride barrier layer 235 and serves as the anode. A second metal layer forms an Ohmic contact 260 with the backside of the substrate 210 and serves as the cathode. A passivation layer 270 fills the trenches 240 and covers the exposed portions of the barrier layer 235.

As indicated in FIG. 2, a continuous conductive path is now provided in the lateral direction through the 2D channel 225 and in the vertical direction through the conductive material 245 lining the trenches 240. In this way when a voltage difference is applied between the anode and cathode a current is generated there between. Advantageously, the lateral distance the current must travel through the two-dimensional channel in the device shown in FIG. 2 is reduced in comparison to the device of FIG. 1. Moreover, the current can be conducted to the cathode through the low-resistivity substrate, thus reducing the total resistance.

The GaN-based diode may be fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HVPE), and Physical Vapor Deposition (PVD).

Figure 3:
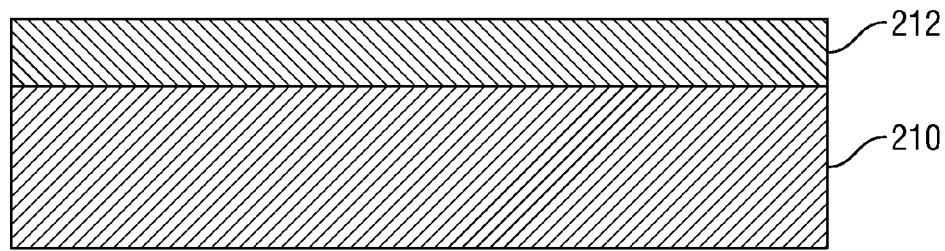
FIGS. 3-7 show one example of a sequence of process steps that may be employed to fabricate the GaN-based diode shown in FIG. 2.
Figure 4:
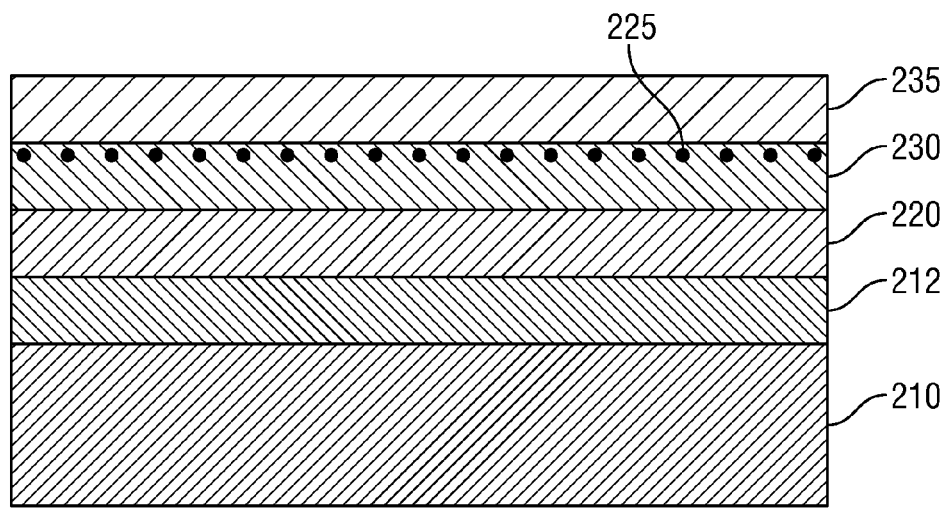
Figure 5:
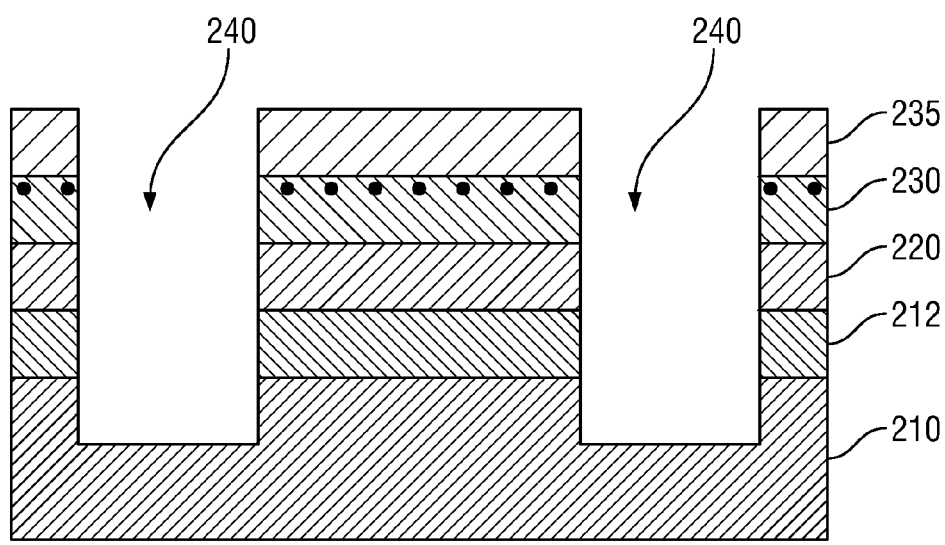

FIGS. 3-5 show one example of a sequence of process steps that may be employed to fabricate the GaN-based diode shown in FIG. 2. To begin the growth of the structure, an optional nucleation layer 212 may be deposited on the substrate 210 (FIG. 3). The substrate 210 is a low resistivity substrate suitable for the deposition of GaN. Illustrative examples of suitable substrates may be formed from heavily-doped silicon or heavily-doped silicon carbide, for example. The nucleation layer 212 may be, for example, an aluminum rich layer such as $Al_xGa_{1-x}N$, where X is in the range 0 to 1. The nucleation layer 212 operates to correct a lattice mismatch between the GaN buffer layer 220 and the substrate 210 by creating an interface between the crystalline structure of the substrate 210 and the crystalline structure of the GaN buffer layer 220.

After depositing the nucleation layer 212, if employed, the GaN buffer layer 220 is deposited on the nucleation layer 212, the GaN epi layer 230 is formed on the buffer layer 220 and the $Al_xGa_{1-x}N$ barrier layer 235 is deposited on the GaN epi layer 230 (FIG. 4). The two-dimensional conduction channel 225, which is a thin, high mobility channel, confines carriers to an interface region between the GaN epi layer 230 and the $Al_xGa_{1-x}N$ barrier layer 235.

The trenches 240, which extend into the substrate 210, may be formed by an etching process (FIG. 5). For example, a photolithographic technique may be employed in which a photoresist is coated on an oxide layer that is formed on the barrier layer 235 to define the trenches 240, which are etched using a plasma etching process such as reactive-ion etching (RIE) or inductively coupled plasma etching (ICP), for instance. It should be noted that the trench bottom can have a variety of configurations including, for example, v-shaped, rounded u-shaped and square configurations.

Figure 6:
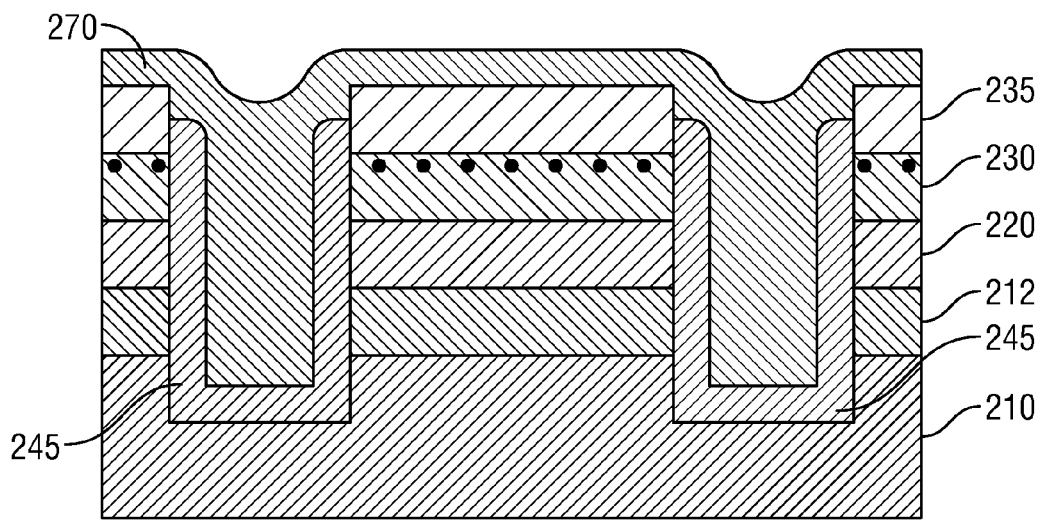

The conductive layer 245 that lines the trench (see FIG. 6) may be formed by sputtering, deposition, or vacuum evaporation of a low-resistivity conductive metal and patterned using lithography and subsequent etching steps. The passivation layer 270 may be fabricated by growing one or more high-quality layers of dielectric material using a technique such as physical vapor deposition (PVD), plasma-enhanced chemical vapor deposition (PECVD), low-pressure chemical vapor deposition (LPCVD), or atomic layer deposition (ALD), for example.

Figure 7:
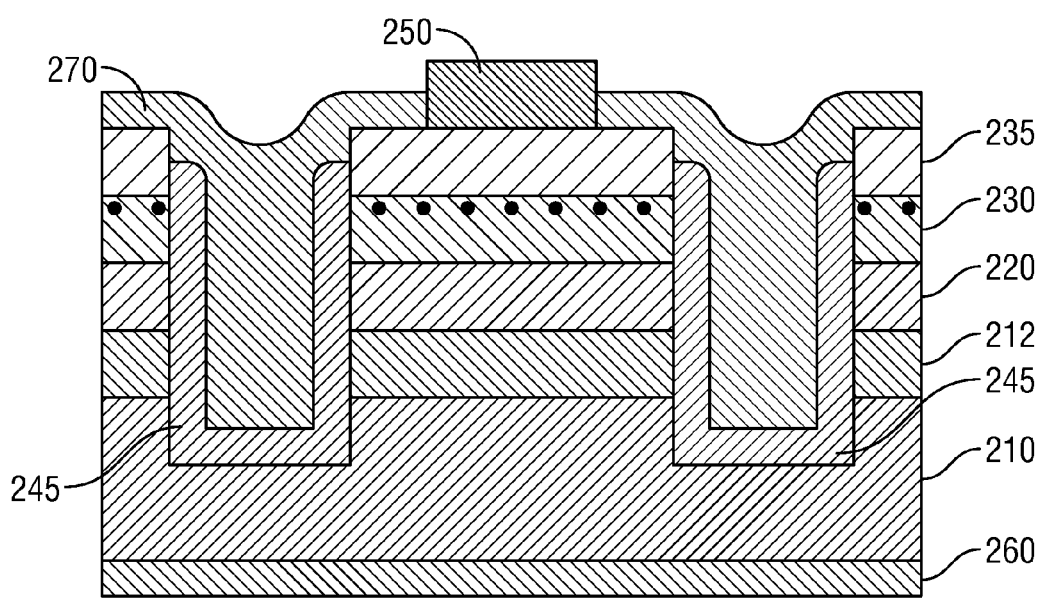

FIG. 7 shows the final device structure after forming the anode 250 and cathode 260. The anode 250 may be formed by first profile shaping the passivation layer 270, followed by the deposition of a Schottky metal by sputtering, deposition, or vacuum evaporation. The anode 250 is then patterned using lithography and subsequent etching steps. The cathode 260 may be fabricated by the deposition of an Ohmic metal using a technique such as sputtering, deposition, or vacuum evaporation, for example.

Figure 8:
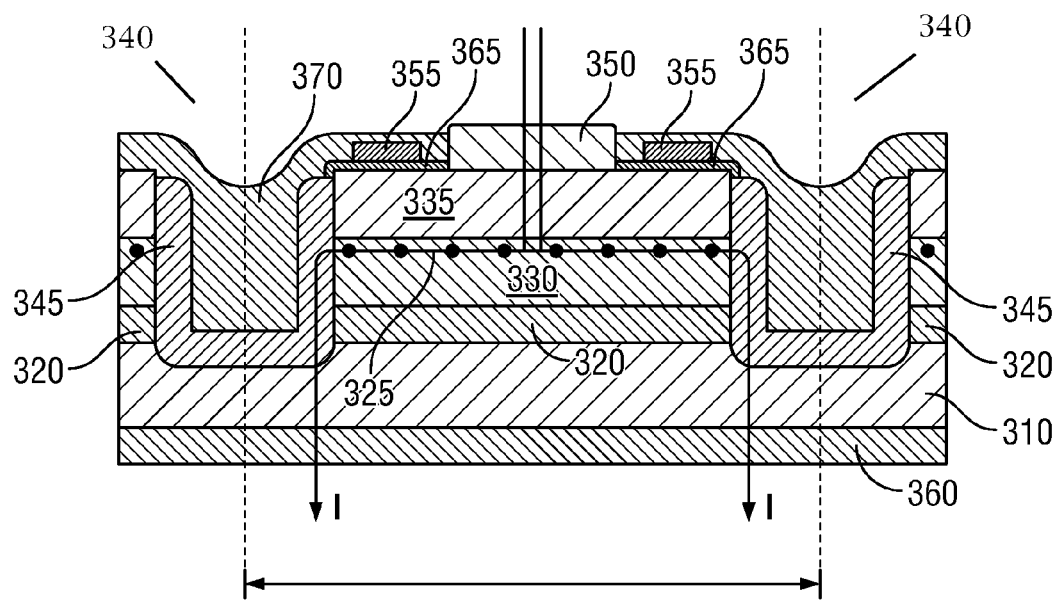
FIGS. 8 and 9 show examples of a GaN-based metal-insulator-semiconductor (MIS) transistor constructed in accordance with the present invention.
Figure 9:
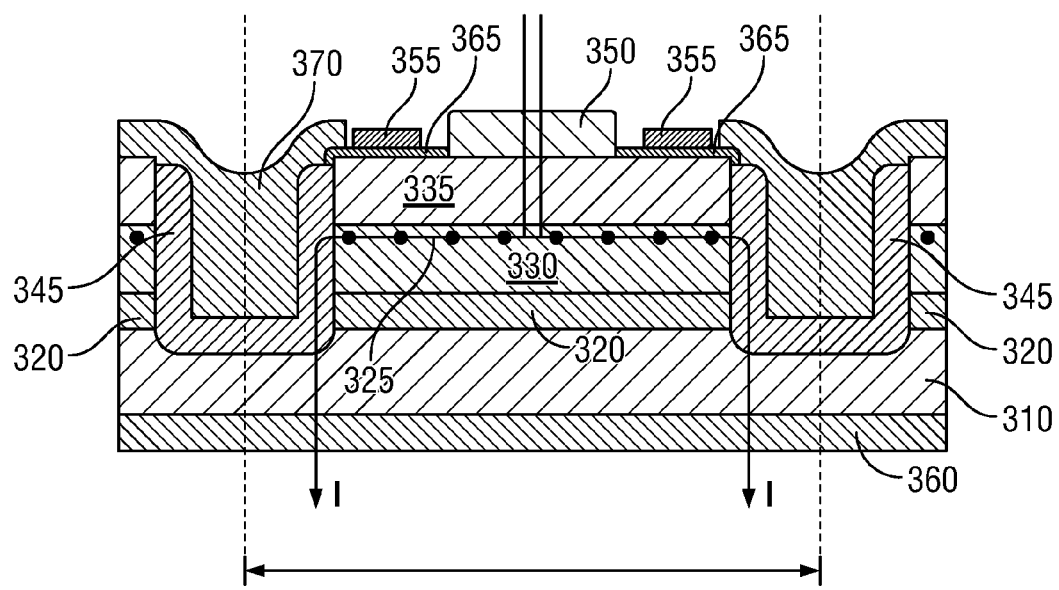

FIGS. 8 and 9 show other examples of GaN-based devices that may be provided with both a lateral conductive path through a two-dimensional channel 325 and a vertical conductive path. More particularly, a transistor or switch is shown which has its source and gate located on the top side of the substrate, where they are in contact with the $Al_xGa_{1-x}N$ barrier layer, and its drain located on the bottom side of the substrate.

FIG. 8 illustrates a metal-insulator-semiconductor (MIS) transistor that includes a substrate 310, a GaN buffer layer 320, a first active layer such as a GaN epi layer 330 and a second active layer such as an aluminum gallium nitride ($Al_xGa_{1-x}N$; $0<X<1$) barrier layer 335. A pair of trenches 340 is etched through the barrier layer 330 and extends into the substrate 310. The trenches 340 are lined with a conductive material 345 such titanium, aluminum or gold. A pair of Schottky contacts 355 is formed on a dielectric material 365, which may be silicon dioxide, silicon nitride, aluminum oxide, aluminum nitride or the like. The dielectric material 365 is formed on the aluminum gallium nitride barrier layer 335, adjacent to the trenches 340, and serves as the gate. The Ohmic electrode 350 is formed directly on the aluminum gallium nitride barrier layer 335 and is located between the gate electrodes 35. The Ohmic electrode 350 serves as the source. An Ohmic drain electrode 360 is formed on the backside of the substrate 310 and serves as the drain. A passivation layer 370 fills the trenches 340 and covers the gate electrodes 355. In an alternative embodiment, shown in FIG. 9, the gate electrodes 355 are exposed.

Figure 10:
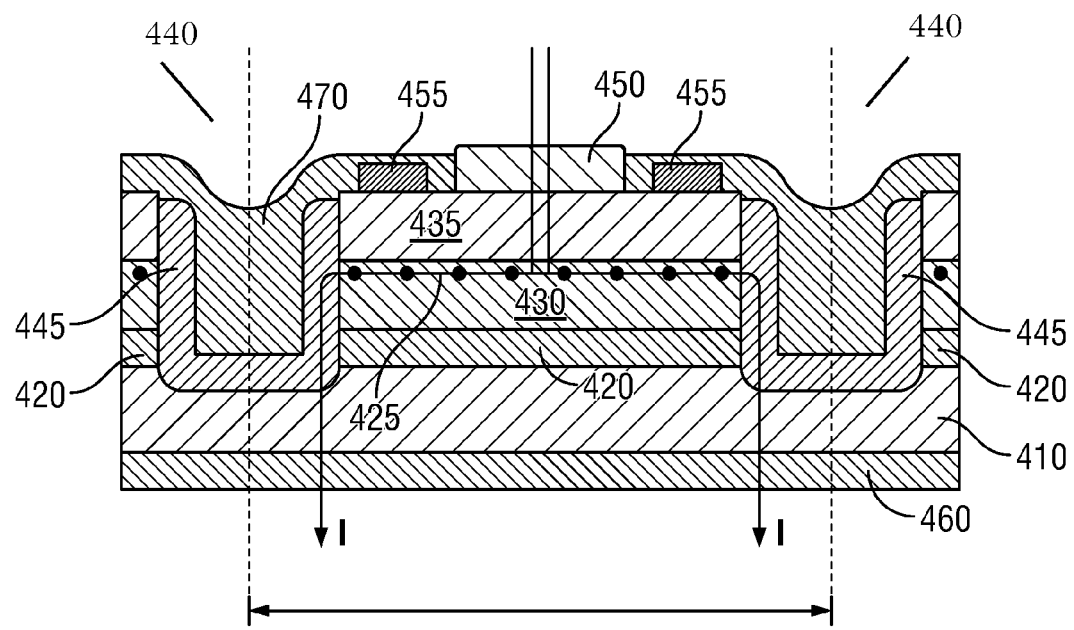
FIGS. 10 and 11 show examples of a GaN-based high-electron-mobility transistor (HEMT) constructed in accordance with the present invention.
Figure 11:
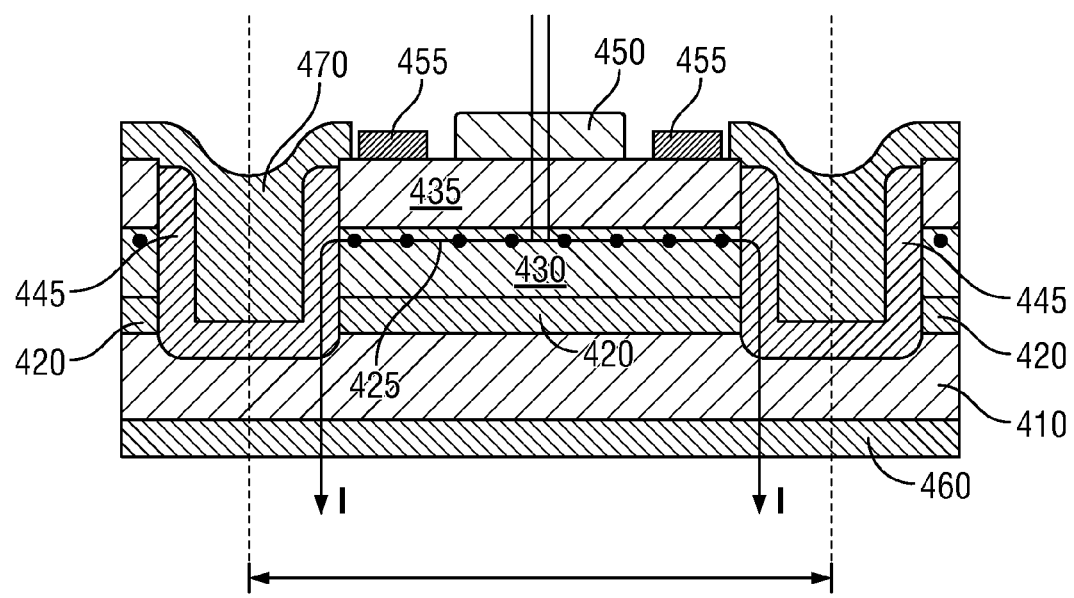

FIG. 10 demonstrates a high-electron-mobility-transistor (HEMT) that includes a substrate 410, a GaN buffer layer 420, a first active layer such as a GaN epi layer 430 and a second active layer such as an aluminum gallium nitride ($Al_xGa_{1-x}N$; $0<X<1$) barrier layer 435. A pair of trenches 440 is etched through the barrier layer 430 and the 2D channel 425 and extends into the substrate 410. The trenches 440 are lined with a conductive material 445 such as titanium, aluminum or gold. A pair of Schottky contacts 455 is formed on the aluminum gallium nitride barrier layer 435 adjacent to the trenches 440 and serves as the gate. An Ohmic electrode 450 is formed directly on the aluminum gallium nitride barrier layer 435 between both gate electrodes 455, and serves as the source. An Ohmic drain electrode 460 is formed on the backside of the substrate 410 and serves as the drain. A passivation layer 470 fills the trenches 440 and covers the gate electrodes 455. In an alternative embodiment, shown in FIG. 11, the gate electrodes 455 are exposed.

Among its other advantages, the power semiconductor devices described above have a reduced total resistance through the low-resistivity conducting path. Additionally, in the case of the diode, because the anode and cathode are located on opposing faces of the device, the die area that is required may be reduced (in some embodiments by about 20%). Thus, the device also has a reduced on-resistance. Moreover, the thermal performance device is enhanced because thermal dissipation occurs on both sides of the die.

Although various embodiments are specifically illustrated and described herein, it will be appreciated that modifications and variations of the present invention are covered by the above teachings and are within the purview of the appended claims without departing from the spirit and intended scope of the invention. For example, while the power semiconductor device has been described as a GaN-based device, the invention more generally encompasses a power semiconductor device that is formed from any Group III nitride compound semiconductor in which the group III element may be gallium (Ga), aluminum (Al), or indium (In).

The invention claimed is:

1. A semiconductor device, comprising:
   a substrate having first and second sides;
   a first active layer disposed over the first side of the substrate;
   a second active layer disposed on the first active layer, the second active layer having a higher bandgap than the first active layer such that a two-dimensional electron gas layer arises between the first active layer and the second active layer;
   at least one trench extending through the first and second active layers and the two-dimensional electron gas layer and into the substrate;
   a conductive material lining the trench;
   a first electrode disposed on the second active layer; and
   a second electrode disposed on the second side of the substrate;
   a third electrode disposed on the second active layer, said first, second and third electrodes being source, drain and gate electrodes, respectively.

2. The semiconductor device of claim 1, wherein the at least one trench comprises a pair of trenches extending through the first and second active layers and the two-dimensional electron gas layer and into the substrate, each of the trenches being lined with a conductive material.

3. The semiconductor device of claim 1, wherein the first active layer includes an epitaxial layer.

4. The semiconductor device of claim 1, wherein the first electrode is a Schottky contact.

5. The semiconductor device of claim 4, wherein the second electrode is an Ohmic contact.

6. The semiconductor device of claim 1, wherein the first active layer comprises a group III nitride semiconductor material.

7. The semiconductor device of claim 6, wherein the first active layer comprises GaN.

8. The semiconductor device of claim 1, wherein the second active layer comprises a group III nitride semiconductor material.

9. The semiconductor device of claim 8, wherein the second active layer comprises $Al_xGa_{1-x}N$, wherein $0<X<1$.

10. The semiconductor device of claim 1, further comprising a dielectric layer disposed between each of the third electrodes and the second active layer.

11. The semiconductor device of claim 1, wherein the third electrodes are Schottky electrodes.

12. The semiconductor device of claim 1, further comprising a passivation material filling the trench.

13. A method of forming a semiconductor device, comprising:
    forming a first active layer on a substrate;
    forming a second active layer over the first active layer, the second active layer having a higher bandgap than the first active layer such that a two-dimensional electron gas layer arises between the first active layer and the second active layer;
    forming at least one trench that extends through the first and second active layers and the two-dimensional electron gas layer and into the substrate;
    lining the trench with a conductive material;
    filling the trench with a passivation material;
    forming a first electrode on the second active layer; and
    forming a second electrode on a bottom side of the substrate;
    forming a third electrode disposed on the second active layer, said first, second and third electrodes being source, drain and gate electrodes, respectively.

14. The method of claim 13, wherein the at least one trench comprises a pair of trenches and further comprising forming a the pair of trenches so that each of the trenches extend through the first and second active layers and the two-dimensional electron gas layer and into the substrate, each of the trenches being lined with a conductive material and filled with a passivation material.

15. The method of claim 13, wherein the first electrode is a Schottky contact.

16. The method of claim 15, wherein the second electrode is an Ohmic contact.

17. The method of claim 13, wherein the first active layer comprises a group III nitride semiconductor material.

* * * * *